(12) United States Patent
Pellizzer et al.

(10) Patent No.: US 8,743,598 B2
(45) Date of Patent: Jun. 3, 2014

(54) REVERSING A POTENTIAL POLARITY FOR READING PHASE-CHANGE CELLS TO SHORTEN A RECOVERY DELAY AFTER PROGRAMMING

(75) Inventors: Fabio Pellizzer, Cornate d'Adda (IT);
Daniele Ielmini, Bergamo (IT);
Agostino Pirovano, Corbetta (IT)

(73) Assignee: Micron Technology, Inc., Boise, ID (US)

( * ) Notice: Subject to any disclaimer, the term of this patent is extended or adjusted under 35 U.S.C. 154(b) by 174 days.

(21) Appl. No.: 12/992,062

(22) PCT Filed: Jul. 29, 2008

(86) PCT No.: PCT/IB2008/001975
§ 371 (c)(1),
(2), (4) Date: Mar. 2, 2011

(87) PCT Pub. No.: WO2010/013081
PCT Pub. Date: Feb. 4, 2010

(65) Prior Publication Data
US 2011/0141799 A1    Jun. 16, 2011

(51) Int. Cl.
*G11C 11/00* (2006.01)
(52) U.S. Cl.
USPC .......................................... 365/163; 365/148
(58) Field of Classification Search
USPC ........................................................ 365/163
See application file for complete search history.

(56) References Cited

U.S. PATENT DOCUMENTS

| | | | |
|---|---|---|---|
| 7,106,618 B2 * | 9/2006 | Morimoto | 365/148 |
| 7,206,216 B2 * | 4/2007 | Osada et al. | 365/148 |
| 7,443,721 B2 * | 10/2008 | Kurotsuchi et al. | 365/163 |
| 7,787,278 B2 | 8/2010 | Bae et al. | |
| 7,859,896 B2 * | 12/2010 | Kurotsuchi et al. | 365/163 |
| 7,903,448 B2 * | 3/2011 | Oh et al. | 365/148 |
| 8,094,485 B2 * | 1/2012 | Shimakawa et al. | 365/148 |
| 2004/0019463 A1 | 1/2004 | Kolessar | |
| 2004/0173319 A1 | 9/2004 | Suzuki et al. | |
| 2006/0194603 A1 * | 8/2006 | Rudelic et al. | 455/550.1 |
| 2007/0097736 A1 | 5/2007 | Inokuchi et al. | |
| 2007/0159871 A1 * | 7/2007 | Osada et al. | 365/148 |
| 2009/0052231 A1 | 2/2009 | Kurotsuchi et al. | |

FOREIGN PATENT DOCUMENTS

| | | |
|---|---|---|
| CN | 102246238 A | 11/2011 |
| DE | 112010000015 T5 | 9/2011 |
| EP | 1 489 622 A | 12/2004 |
| EP | 1489622 | 12/2004 |
| JP | 2000164582 A | 6/2000 |
| JP | 2001522141 A | 11/2001 |
| JP | 2002503765 A | 2/2002 |

(Continued)

OTHER PUBLICATIONS

International Search Report and Written Opinion for PCT Counterpart Application No. PCT/IB2008/001975 (Mar. 23, 2009).

(Continued)

*Primary Examiner* — Son Mai
(74) *Attorney, Agent, or Firm* — Schwegman, Lundberg & Woessner, P.A.

(57) ABSTRACT

A potential supplied to selected cells in a Phase Change Memory (PCM) is reversed in polarity following a program operation to suppress a recovery time and provide device stabilization for a read operation.

16 Claims, 7 Drawing Sheets

(56) References Cited

FOREIGN PATENT DOCUMENTS

| JP | 2002529594 A | 9/2002 |
|---|---|---|
| JP | 2004266127 A | 9/2004 |
| JP | 2004355689 A | 12/2004 |
| JP | 2005514722 A | 5/2005 |
| JP | 200686526 A | 3/2006 |
| JP | 2011529610 | 12/2011 |
| KR | 20090020943 A | 2/2009 |
| KR | 1020090020943 A | 2/2009 |
| WO | WO-9923690 A1 | 5/1999 |
| WO | WO-9941426 A1 | 8/1999 |
| WO | WO-0026939 A1 | 5/2000 |
| WO | WO-2007088626 | 8/2007 |
| WO | WO 2007/088626 A1 | 9/2007 |
| WO | WO-2008010290 A1 | 1/2008 |
| WO | WO-2010013081 A1 | 2/2010 |

OTHER PUBLICATIONS

"International Application Serial No. PCT/IB2008/001975, International Search Report mailed Apr. 16, 2009", 2 pgs.
"International Application Serial No. PCT/IB2008/001975, International Written Opinion mailed Apr. 16, 2009", 5 pgs.
Japanese Application Serial No. 2011-520605, Office Action mailed Nov. 29, 2012, 10 pgs.
Japanese Application Serial No. 2011-520605, Response filed May 28, 2013 to Office Action mailed Nov. 29, 2012, 9 pgs.
Chinese Application Serial No. 200880129821.8, Office Action mailed Aug. 5, 2013, 13 pgs.
Korean Application Serial No. 10-2010-7029002, Office Action mailed Sep. 13, 2013, 8 pgs.

* cited by examiner

US 8,743,598 B2

REVERSING A POTENTIAL POLARITY FOR READING PHASE-CHANGE CELLS TO SHORTEN A RECOVERY DELAY AFTER PROGRAMMING

CROSS REFERENCE TO RELATED APPLICATION

This patent application is a U.S. National Phase application under 35 U.S.C. §371 of International Application No. PCT/IB2008/001975 filed on Jul. 29, 2008, entitled REVERSING A POTENTIAL POLARITY FOR READING PHASE-CHANGE CELLS TO SHORTEN A RECOVERY DELAY AFTER PROGRAMMING.

Phase Change Memory (PCM) is a promising nonvolatile memory technology for the next generation due to favorable write speeds, small cell sizes, simpler circuitries and a fabrication compatibility with the Complementary Metal-Oxide-Semiconductor (CMOS) process. PCM is based on a phase transition of a chalcogenide material that may be programmed by resistive heating with current pulses that transition the memory cell into high and low resistance states. Improvements to reduce delays in reading stored data from the difference resistance are needed.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
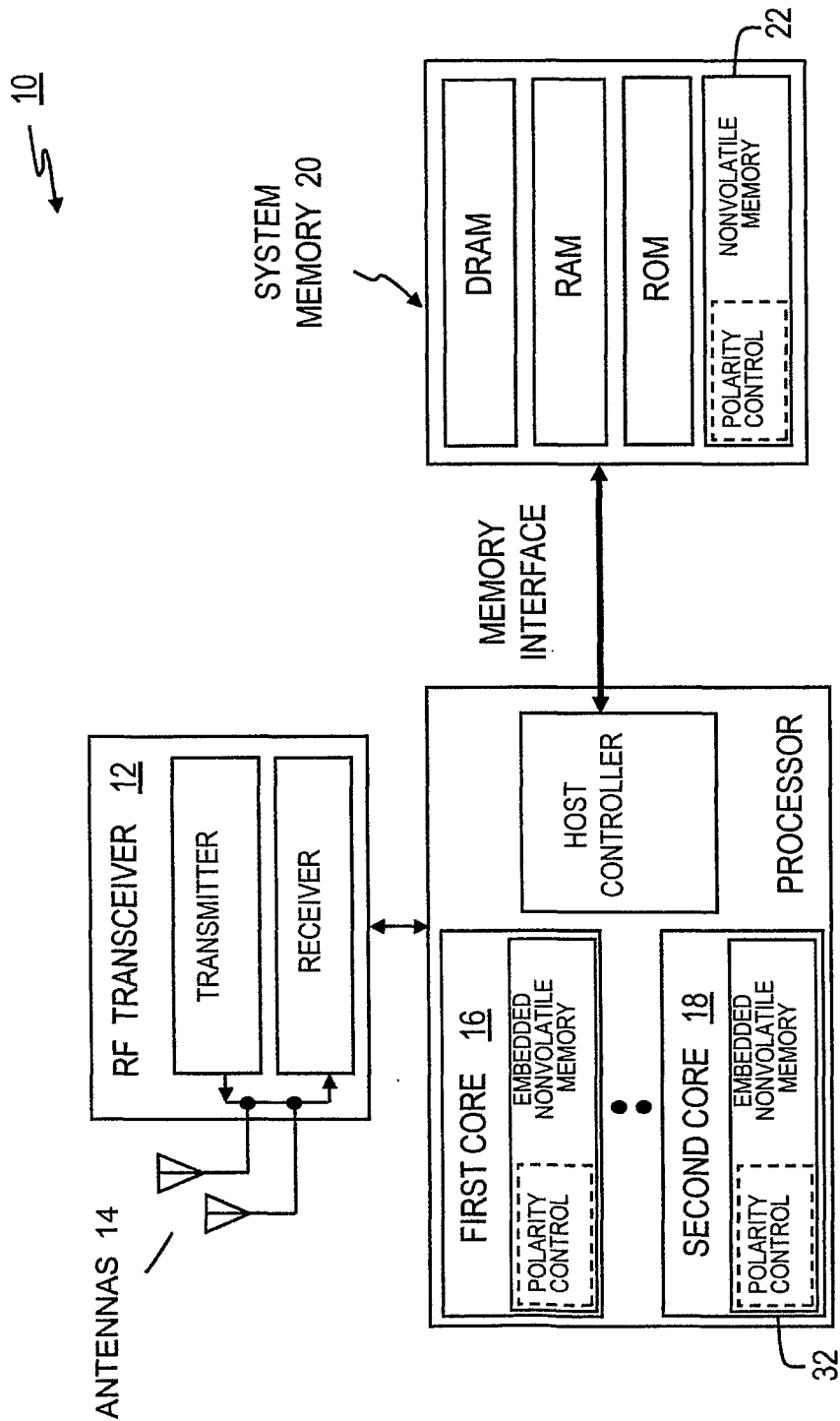
FIG. 1 illustrates a wireless architecture that incorporates Phase Change Memory (PCM) with polarity reversing in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

The embodiment illustrated in FIG. 1 shows a communications device 10 that may include nonvolatile memory with polarity reversing capabilities in accordance with the present invention within the wireless architecture (polarity reversing is described in later figures). Communications device 10 may include one or more antenna structures 14 to allow radios to communicate with other over-the-air communication devices. As such, communications device 10 may operate as a cellular device or a device that operates in wireless networks such as, for example, Wireless Fidelity (Wi-Fi) that provides the underlying technology of Wireless Local Area Network (WLAN) based on the IEEE 802.11 specifications, WiMax and Mobile WiMax based on IEEE 802.16-2005, Wideband Code Division Multiple Access (WCDMA), and Global System for Mobile Communications (GSM) networks, although the present invention is not limited to operate in only these networks. The radio subsystems collocated in the same platform of communications device 10 provide the capability of communicating with different frequency bands in an RF/location space with other devices in a network.

The embodiment illustrates the coupling of antenna structure 14 to a transceiver 12 to accommodate modulation/demodulation. In general, analog front end transceiver 12 may be a stand-alone Radio Frequency (RF) discrete or integrated analog circuit, or transceiver 12 may be embedded with a processor having one or more processor cores 16 and 18. The multiple cores allow processing workloads to be shared across the cores and handle baseband functions and application functions. Data and instructions may transfer through an interface between the processor and memory storage in a system memory 20.

System memory 20 may include both volatile and a nonvolatile memory 22 having a phase change material. Nonvolatile memory 22 may be referred to as a Phase Change Memory (PCM), Phase-Change Random Access Memory (PRAM or PCRAM), Ovonic Unified Memory (OUM) or Chalcogenide Random Access Memory (C-RAM). The volatile and nonvolatile memories may be combined in a stacking process to reduce the footprint on a board, packaged separately, or placed in a multi-chip package with the memory component placed on top of the processor. The embodiment also illustrates that nonvolatile memory 32 may be embedded with one of the processor cores.

The PCM cells include the alloys of elements of group VI of the periodic table, elements such as Te or Se for example are referred to as chalcogenides or chalcogenic materials. Chalcogenides may be used advantageously in phase change memory cells to provide data retention and remain stable even after the power is removed from the nonvolatile memory. Taking the phase change material as $Ge_2Sb_2Te_5$ for example, two phases are exhibited having distinct electrical characteristics useful for memory storage, i.e., an amorphous phase (reset state) showing a high resistance and a crystalline phase (set state) showing a low resistance.

The electronic behavior of the chalcogenide material used in phase-change memory (PCM) is key in defining the operational voltages and the response times of the memory cell. The threshold voltage for electronic switching of the amorphous chalcogenide material is an indicator of the boundary that exists between the programming and readout operations. For instance, when the programming operation switches the memory cell from the crystalline phase to the amorphous phase, there exists a recovery time period for the resistance to stabilize as an electronic phenomenon typical of chalcogenide materials.

Figure 2:
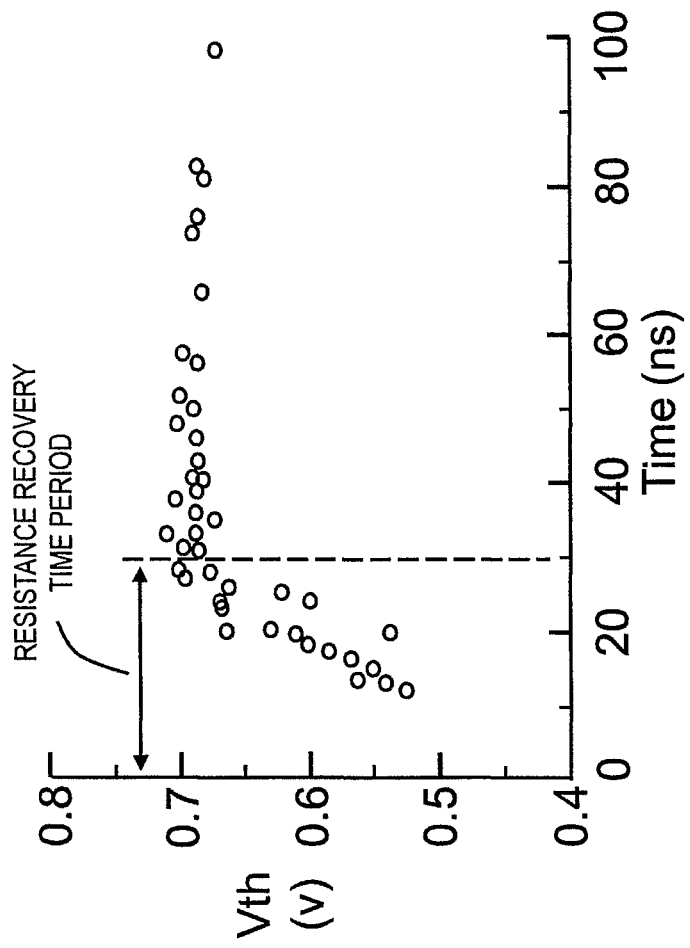
FIG. 2 illustrates a time-resolved analysis of threshold voltage VT(t) showing the resistance recovery of a PCM device following a programming operation that makes the PCM material amorphous.

FIG. 2 illustrates a time-resolved analysis of threshold voltage Vth showing the resistance recovery of the PCM device following the programming operation that makes the PCM material amorphous. Starting from the crystalline phase, sufficient energy driven into the chalcogenide material raises the local temperature above the melting temperature (Tm). The alloy's energized atoms move into random arrangements, where a sudden stopping of the energy pulse provides rapid quenching that freezes the atoms into a random, amorphous, or semi-amorphous "reset" state.

As stated, the figure shows the time following the programming operation. The time period marked "resistance recovery time period" is characterized by a low threshold voltage and a low resistance of the bit. Therefore, it should be noted that the PCM device having just been programmed to the amorphous phase is not readily distinguishable during the resistance recovery time period from the characteristics of the PCM device in the crystalline (set) phase. The high Vth and the high resistance that are characteristics of the amorphous phase are exhibited by the PCM device only after the resistance recovery time period, a reading operation delay of about 30 ns. The recovery time is a "dark region of time" not available for reading because a reset bit is not reliably distinguished from a set bit, noting that both bits are low resistivity (highly conductive).

Figure 3:
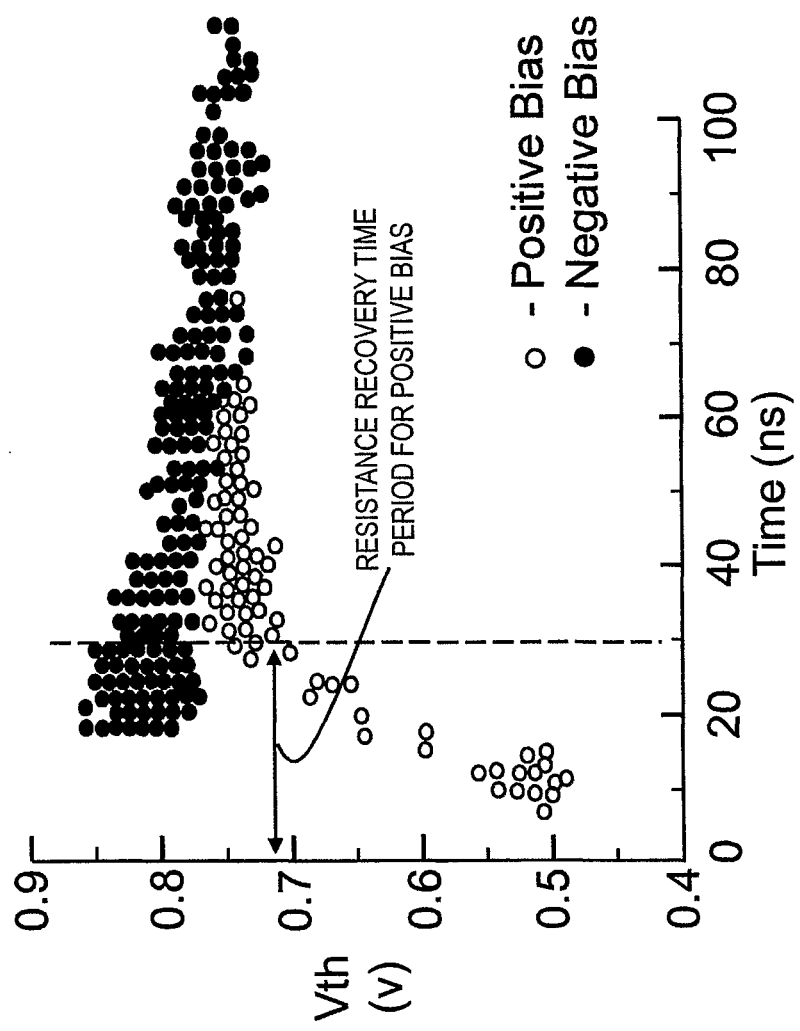
FIG. 3 shows a recovery time for both a positive applied bias and a negative applied bias.

FIG. 3 shows the recovery time for both a positive applied bias and a negative applied bias. The figure illustrates the threshold voltage Vth evolution for both a "negative" and a "positive" reading voltage after a memory cell reset operation performed with a positive voltage, where "negative" and "positive" are in reference to the bottom electrode of the storage element as the ground node. Note that the recovery time is dramatically reduced if a reverse polarity is applied to the selector device after programming in accordance with the present invention.

Figure 4:
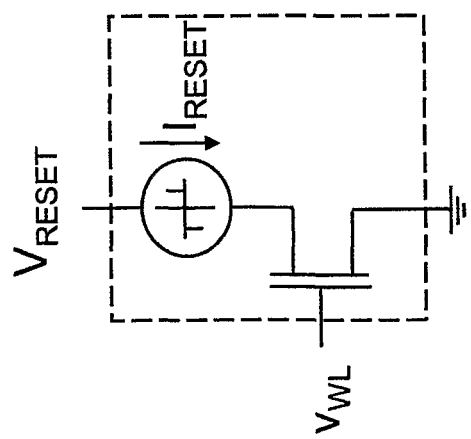
FIG. 4 shows a memory cell that includes storage material in combination with a selector device biased for positive programming.

FIG. 4 shows a memory cell that includes storage material in combination with a selector device biased for positive programming. The biasing avoids MOSFET body effect that would increase the threshold voltage of the selector device and reduce its current driving capability. Since the current $I_{RESET}$ that flows in the storage material to reset a bit is usually high, as high as 1 mA in some cases, it is preferred to reset the storage element with a positive voltage.

Figure 5:
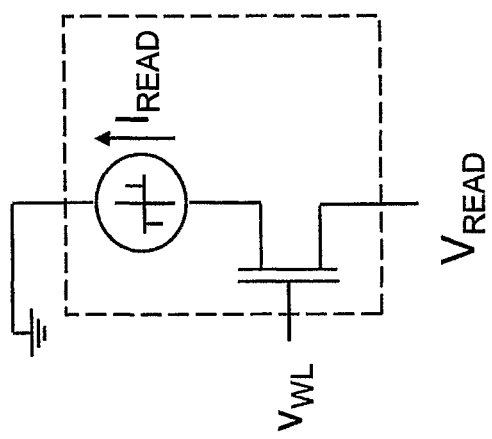
FIG. 5 illustrates biasing the memory cell for negative reading.

On the other hand, current flowing during reading is typically a lower current and may have a value of about 100 uA, and therefore, the polarity may be reversed without adversely affecting the body effect of the select device. FIG. 5 illustrates biasing the memory cell for negative reading. Each source line runs perpendicular to word lines and is kept separated from other word lines in order to select one single bit during the read operation.

Note that the selector device is not a rectifier, e.g. a diode, because current flows in one direction during programming and in an opposite direction during reading. The N-channel MOSFET devices shown in FIGS. 4 and 5 allows current flow in either direction with the source and drain terminals being inter-changeable. It should also be noted that the read operation of a crystalline bit may be performed with either polarity since the crystalline bit does not suffer from recovery time.

Figure 6:
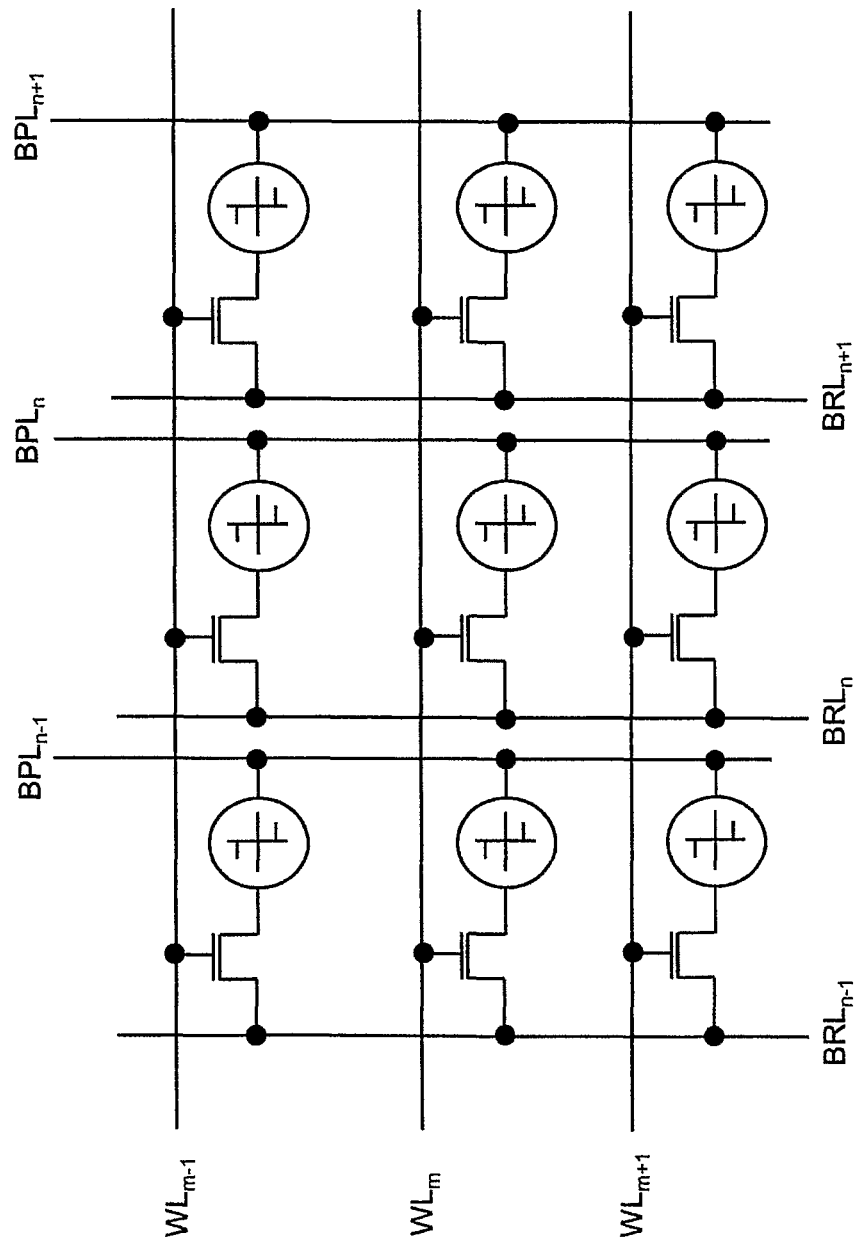
FIG. 6 shows a memory array organization that includes a selector device and a memory storage element to store one or more bits of information at each memory cell location.

FIG. 6 shows a 3×3 memory array organization that includes a selector device and a memory storage element to store one or more bits of information at each memory cell location. Note that the 3×3 array provides a simplistic memory array and the scope of the present invention is not limited in this respect. The gates of the selector devices located in a particular row of the array receive a selector voltage, denoted in the various rows as $WL_{m-1}$, $WL_m$, and $WL_{m+1}$. The program lines addressing the storage elements at the column locations are Bit Program Lines (BPLs) denoted by $BPL_{n-1}$, $BPL_n$, and $BPL_{n+1}$. The read lines addressing the selector device conduction terminals along a column of memory cell locations are Bit Read Lines (BRLs) denoted by $BRL_{n-1}$, $BRL_n$, and $BRL_{n+1}$.

Figure 7:
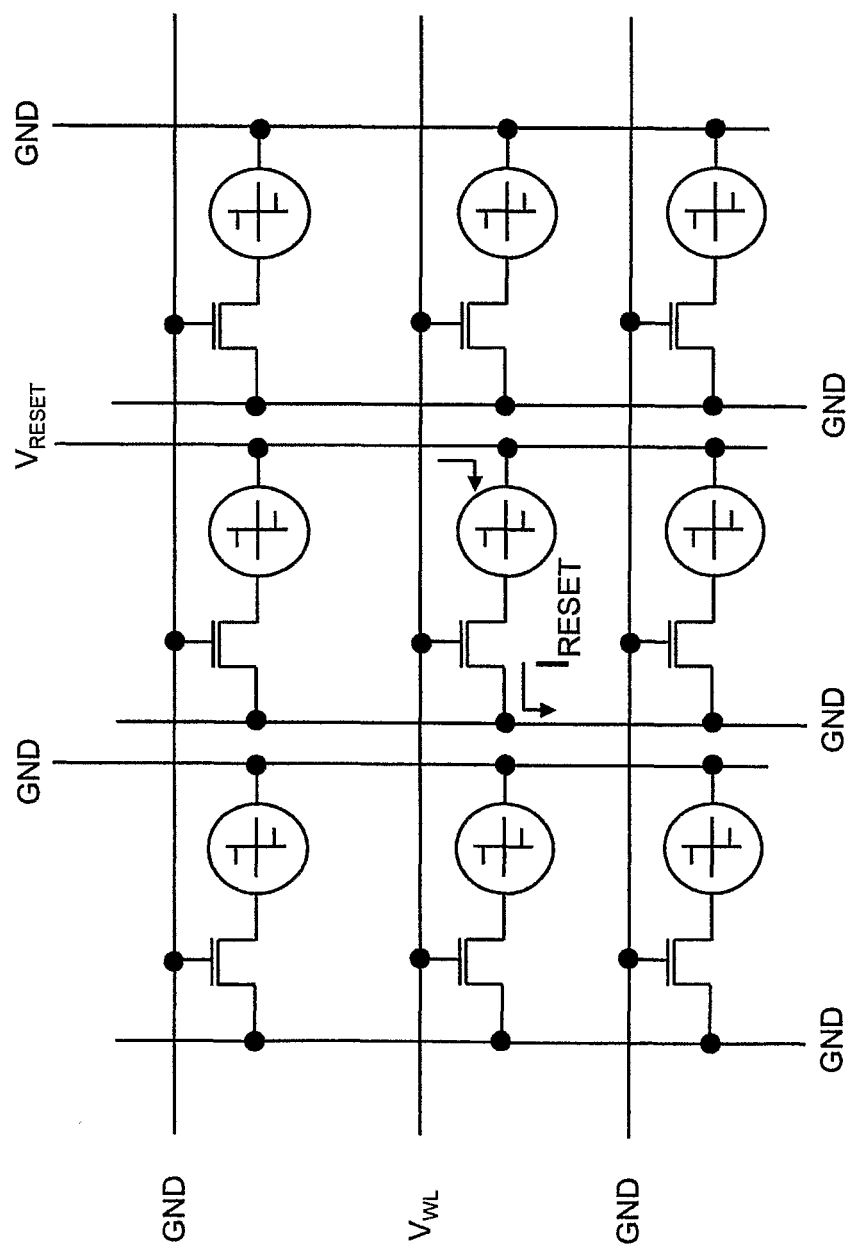
FIG. 7 shows the memory array organization biased for programming to an amorphous phase.

FIG. 7 shows the memory array organization illustrated in FIG. 6 biased for programming the selected memory cell to an amorphous phase. During programming to the reset state (or set state), a positive voltage $V_{RESET}$ (or $V_{SET}$) in the voltage range of 1 volt to 5 volts is applied to the selected Bit Program Line (BPL), keeping all the other BPLs and the Bit Read Lines, i.e. source lines, at ground potential (GND). The selected word line $V_{WL}$ is biased in the voltage range of 1 volt to 5 volts in order to turn on the desired selector device. An electrical current $I_{RESET}$ flows through the phase change material when the applied voltage potential is greater than the threshold voltage of the phase change material. Once the applied bias is larger than the threshold voltage and the current $I_{RESET}$ heats the storage material, threshold switching occurs and the material turns into a dynamic on state.

Figure 8:
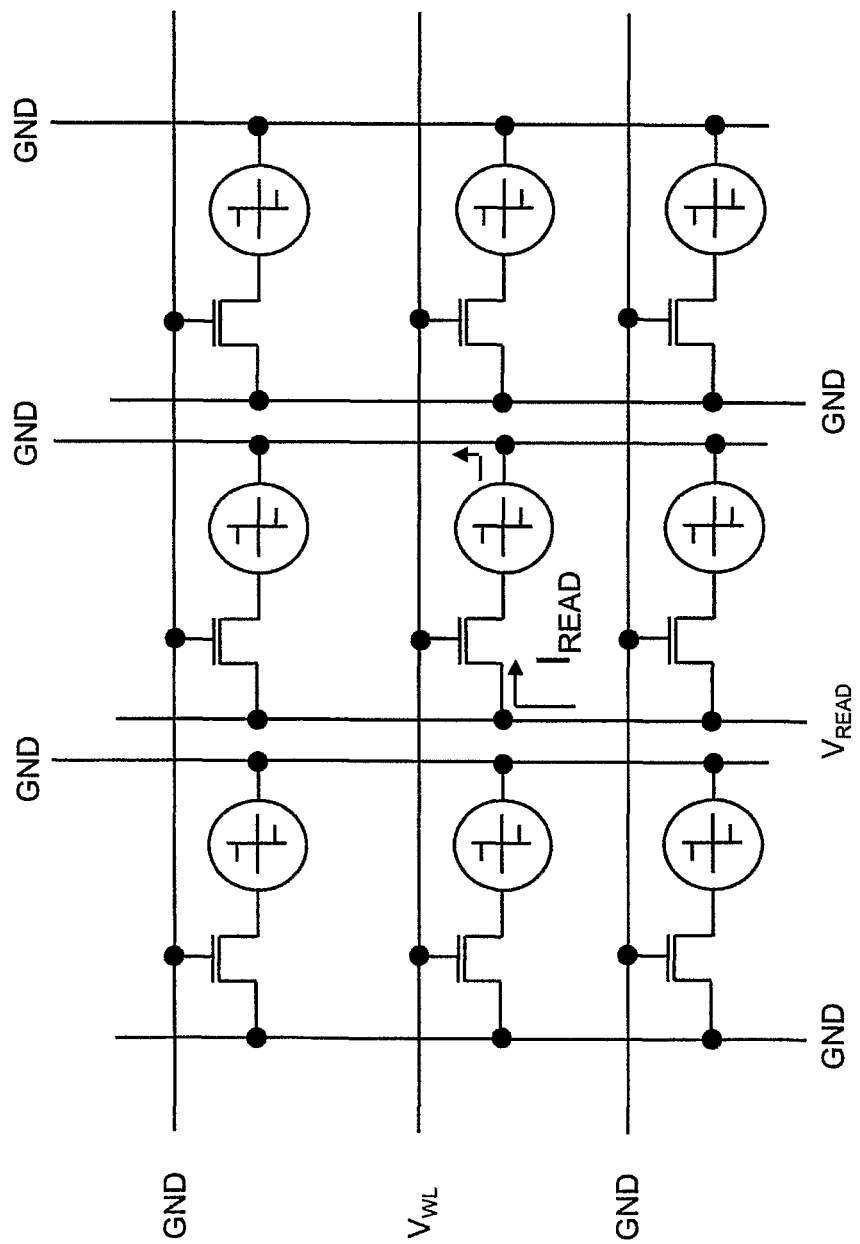
FIG. 8 shows the memory array organization biased to implement negative reading in accordance with the present invention.

FIG. 8 shows the memory array organization illustrated in FIG. 6 biased to implement negative reading in accordance with the present invention. During the read operation a positive read voltage $V_{READ}$ in the voltage range of 0.2 volt to 0.4 volt is applied to the selected Bit Read Line (BRL), keeping all the other BRLs and all the BPLs at ground. A word line $V_{WL}$ may be biased in the voltage range of 1 volt to 5 volts to select the desired selector device. The current $I_{READ}$ flowing in the storage material is sensed to determine the phase of the selected bit.

The figures illustrate a MOSFET selector but it should be noted that any bi-directional selector device may be used. One such example of a bi-directional selector device is an Ovonic Threshold Switch (OTS) that has symmetric I-V characteristics. It is to be appreciated that the association of reset and set with amorphous and crystalline states, respectively, is a convention and that at least an opposite convention may be adopted.

By now it should be apparent that embodiments of the present invention include a MOSFET device connected to a chalcogenide material, where a potential supplied to a memory cell is reversed in polarity following a program operation to suppress a recovery time and provide device stabilization for a read operation. Whereas, in a program operation the selected memory cell receives a positive voltage $V_{RESET}$ on the chalcogenide material side and a ground potential on the selector device side, a reversed polarity is supplied during the read operation so that the chalcogenide material receives the ground potential and the selector device receives a positive voltage $V_{READ}$.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:
1. A storage system, comprising:
    memory cells commonly connected to a program line in a column of a memory array, each of the memory cells having a selector device and a storage device coupled in series, the selector device having a first conduction terminal and a second conduction terminal, the second conduction terminal commonly connected to a read line to receive a first voltage potential during a read operation and the first conduction terminal commonly connected to the program line via the storage device to receive a ground potential during the read operation; the second conduction terminal commonly connected to the read line to receive the ground potential during a program operation and the first conduction terminal commonly connected to the program line via the storage device to receive a second voltage potential during the program operation, the program operation being selectable from a set state and a reset state.

2. The storage system of claim 1, wherein a value of the second voltage potential is greater than a value of the first voltage potential.

3. The storage system of claim 1, wherein the first voltage potential to be received by the read line is a potential greater than the ground potential during a read operation of the storage system.

4. The storage system of claim 1, wherein the first voltage potential to be received by the read line is in a range of 0.2 to 0.4 volts during the read operation of the storage system.

5. The storage system of claim 1, wherein the first voltage potential to be applied to the read line following the second voltage potential to be applied to the program line is to reduce a recovery time by providing a reverse current flow to the selector device after programming.

6. A storage cell, comprising:
a selector device having a first conduction terminal coupled to a first terminal of a storage element and to a program line via the storage element, a second terminal of the storage element is to receive a first positive potential through the program line during a program operation and a ground potential through the program line during a read operation, a second conduction terminal of the selector device is coupled to a read line to receive the ground potential during the program operation and a second positive potential during the read operation, the program operation being selectable from a set state and a reset state.

7. The storage cell of claim 6 wherein the second positive potential is to be received following the programming operation to reduce a recovery time of the storage cell.

8. The storage cell of claim 6 wherein the second positive potential is to provide a reverse polarity to the selector device after programming.

9. The storage cell of claim 6 wherein the selector device is a Metal Oxide Semiconductor Field Effect Transistor (MOSFET) device.

10. The storage cell of claim 6 wherein the selector device is an Ovonic Threshold Switch (OTS).

11. The storage cell of claim 6 wherein the storage element is chalcogenide material used in Phase-Change Memory (PCM).

12. A Phase-Change Memory (PCM), comprising:
a memory cell having a first terminal connected to a source of a selector device and a second terminal connected to a chalcogenide material, the selector device and the chalcogenide material being coupled in series, the first terminal and the second terminal being configured to have values of voltage potentials coupled thereto such that current flowing through the selector device and the chalcogenide material is reversed in direction following a program operation to suppress a recovery time and provide stabilization for a read operation, the first terminal being configured to receive a ground potential during the program operation of the PCM and the second terminal is configured to receive a positive voltage potential during the program operation, the first terminal being further configured to receive a positive voltage potential during the read operation of the PCM and the second terminal is configured to receive a ground potential during the read operation.

13. A wireless communication system, comprising:
a transceiver; and
a first processor core and a second processor core each coupled to the transceiver, the first processor core to store information in an embedded Phase-Change Memory (PCM) having memory cells that include a selector device and a chalcogenide material coupled in series between a first terminal and a second terminal, the selector device and the chalcogenide material to receive a first voltage potential in a read operation and a second voltage potential in a programming operation, the second voltage potential to cause current to flow through the selector device and the chalcogenide material in a direction opposite a current flow induced by the first voltage potential applied during the read operation, the first terminal being configured to receive a ground potential during the programming operation of the PCM and the second terminal is configured to receive a positive voltage potential during the programming operation, the first terminal being further configured to receive a positive voltage potential during the read operation of the PCM and the second terminal is configured to receive the ground potential during the read operation.

14. The wireless communication system of claim 13, wherein the second terminal is to receive the first voltage potential in a range of 1.0 to 5.0 volts during the programming operation of the PCM.

15. The wireless communication system of claim 13, wherein the first terminal is to receive a positive voltage potential in a range of 0.2 to 0.4 volts during the read operation of the PCM.

16. A storage cell, comprising:
a storage element having a first terminal and a second terminal; and
a selector device having a first conduction terminal coupled to the first terminal of the storage element, the second terminal of the storage element being configured to receive a first positive voltage potential during a program operation and a ground potential during a read operation, a second conduction terminal of the selector device being configured to receive the ground potential via the first conduction terminal during the program operation and a second positive voltage potential via the first conduction terminal during the read operation, the program operation being selectable from a set state and a reset state.

\* \* \* \* \*